United States Patent
Tai et al.

(10) Patent No.: US 7,323,245 B2
(45) Date of Patent: Jan. 29, 2008

(54) ELECTRIC CONNECTING PART

(75) Inventors: Tomishige Tai, Tokyo (JP); Seiya Takahashi, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 60 days.

(21) Appl. No.: 10/551,067

(22) PCT Filed: Mar. 19, 2004

(86) PCT No.: PCT/JP2004/003721

§ 371 (c)(1),
(2), (4) Date: Sep. 29, 2005

(87) PCT Pub. No.: WO2004/089047

PCT Pub. Date: Oct. 14, 2004

(65) Prior Publication Data
US 2006/0180338 A1    Aug. 17, 2006

(30) Foreign Application Priority Data
Mar. 31, 2003    (JP) ............................. 2003-093835

(51) Int. Cl.
*B32B 5/16* (2006.01)
(52) U.S. Cl. ...................... 428/407; 428/378; 428/379; 428/320.2
(58) Field of Classification Search ............... 174/254, 174/255, 257; 428/378–379, 407, 320.2
See application file for complete search history.

(56) References Cited

U.S. PATENT DOCUMENTS

| | | | | |
|---|---|---|---|---|
| 3,057,952 A | * | 10/1962 | Gordon | .................. 174/117 R |
| 3,215,574 A | * | 11/1965 | Korb | ............................ 216/20 |
| 4,306,925 A | * | 12/1981 | Lebow et al. | ................ 156/150 |
| 4,824,511 A | * | 4/1989 | Hartman et al. | .......... 156/306.6 |
| 5,219,640 A | * | 6/1993 | Gazit et al. | .................. 428/209 |
| 5,972,152 A | * | 10/1999 | Lake et al. | ................... 156/247 |
| 6,398,560 B1 | | 6/2002 | Mizuno | |
| 6,426,143 B1 | * | 7/2002 | Voss et al. | ................... 428/378 |
| 6,458,234 B1 | * | 10/2002 | Lake et al. | .................. 156/230 |
| 6,792,679 B1 | * | 9/2004 | Tai et al. | ....................... 29/877 |
| 6,815,126 B2 | * | 11/2004 | Fey et al. | ....................... 430/9 |

FOREIGN PATENT DOCUMENTS

| | | |
|---|---|---|
| JP | 7-336026 | 12/1995 |
| JP | 2000-223835 | 8/2000 |
| JP | 3-110408 | 9/2000 |
| JP | 2004-39543 | 2/2004 |
| WO | WO 00-54324 | 9/2000 |

* cited by examiner

*Primary Examiner*—Cathy F. Lam
(74) *Attorney, Agent, or Firm*—Collard & Roe, P.C.

(57) ABSTRACT

It comprises an electric conduction pattern member (11) which is flexible and plate-shaped, a gel member (13) having the electric conduction pattern member embedded therein, and flexible substrate sheets (15a, 15b) holding the gel member therebetween, the electric conduction pattern member (11) having the function of allowing the gel member (13) to be deformed and displaced by an external bending force, the stress due to the external bending force being dispersed by the gel member (13).

7 Claims, 2 Drawing Sheets

ELECTRIC CONNECTING PART

CROSS REFERENCE TO RELATED APPLICATIONS

Applicants claim priority under 35 U.S.C. §119 of Japanese Application No. 2003-93835 filed Mar. 31, 2003. Applicants also claim priority under 35 U.S.C. §365 of PCT/JP2004/003721 filed Mar. 19, 2004. The international application under PCT article 21(2) was not published in English.

TECHNICAL FIELD

This invention relates to an electrical connection component for achieving electrical connection and, in particular, relates to an electrical connection component suitable for connection at a portion subjected to bending between a printed circuit board and a liquid crystal display device (hereinafter referred to as an LCD) in a folding portable telephone or at a portion subjected to bending caused by driving.

BACKGROUND ART

Conventionally, there has been generally known a method wherein an LCD and a flexible board (flexible wiring board) mounted with, by the use of bonding wires, an LCD driver IC for controlling driving and display of the LCD are electrically and mechanically connected together by bonding, with thermal pressurization, the flexible board to a terminal portion of the LCD by the use of heat sealing or an ACF (anti-conductive film).

There is one wherein, in order to mount a flexible board on a printed circuit board, the flexible board is bent downward of an LCD near a connecting portion between the LCD and the flexible board so as to be folded double, thereby mounting the flexible board between an LCD frame and the printed circuit board.

A flexible board in prior art 1 comprises an elongated base board, a plurality of wiring patterns formed on the base board, and a plurality of reinforcing portions formed on the base board. The plurality of reinforcing portions are disposed so as to extend in a longitudinal direction of the base board. Part of the wiring patterns are formed at positions offset from the respective reinforcing portions in a width direction of the base board.

Since a portion of the base board where the reinforcing portion is formed is more reluctant to bend than a portion where the reinforcing portion is not formed, bending stress is concentrated at the portion where the reinforcing portion is not formed. Part of the wiring patterns are formed at positions offset from the reinforcing portions in an axial direction of the base board. When the base board is rolled up, since portions where at least part of the wiring patterns are formed are reluctant to bend due to the reinforcing portions, it is possible to prevent deformation of the wiring patterns [see, e.g. Republished Patent International Publication No. WO0054324 (patent document 1)].

On the other hand, in prior art 2, there is a portable telephone LCD holding structure comprising an LCD, a printed circuit board mounted with various electrical circuits, a flexible board having an LCD drive circuit and mounted on the printed circuit board so as to be electrically connected thereto through the LCD and a bending portion, and a frame member holding the LCD on its upper surface and supported by the printed circuit board, wherein assembling is made by folding the bending portion continuous with the flexible board so that the LCD, the frame member, the flexible board, and the printed circuit board are disposed in the order named from above [see, e.g. Japanese Patent No. 3110408 (patent document 2)].

Further, in prior art 3, there is a multilayer wiring board comprising a flexible bending portion, wiring layers forming the bending portion, and a flat portion having more wiring layers than the bending portion, wherein a boundary portion is provided between the flat portion and the bending portion, in which the number of wiring layers is reduced stepwise as compared with the flat portion.

In this multilayer wiring board, stress concentration is relaxed at the boundary portion between the flat portion and the bending portion of the wiring board having the bending portion, thereby preventing failure such as breakage of the board or cutting of wiring patterns [see, e.g. Japanese Unexamined Patent Application Publication No. 2000-223835 (patent document 3)].

However, in prior art 1 or 2, since a technique is adopted to improve bending resistance by performing additional processing such as shaving thinly the portion subjected to bending to increase flexibility and unifying a reinforcing plate, the additional processing is required to cause an increase in cost. Further, there is a problem that sufficient resistance cannot be obtained even by taking such a measure.

As a cause therefor, there is a problem in terms of a material such that use is made of copper having high conductivity as a metal for use and the copper has a narrow elastic range and easily gives rise to stress movement in repetitive bending.

Further, in prior art 1 or 2, there is a problem that since it is difficult to accurately dispose wiring due to processing variation, the resistance is reduced due to subjection to stress.

Generally, a base material provided with a wiring pattern is often a polyimide resin and therefore the intrinsic problem has not been solved that since the polyimide resin is a hard resin having elasticity, stress concentration is liable to occur so that the resistance is degraded due to buckling or excessive deformation caused by bending.

Further, in prior art 3, a base material provided with the wiring patterns is a polyimide resin and additional processing is required.

It is therefore an object of this invention to provide an electrical connection component that can improve the bending resistance.

DISCLOSURE OF THE INVENTION

According to this invention, there is provided an electrical connection component characterized by comprising a plate-like flexible conductive pattern member, a sheet-like gel member having said conductive pattern member embedded therein, and flexible base material sheets retaining said gel member therebetween

BEST MODE FOR CARRYING OUT THE INVENTION

Figure 1:
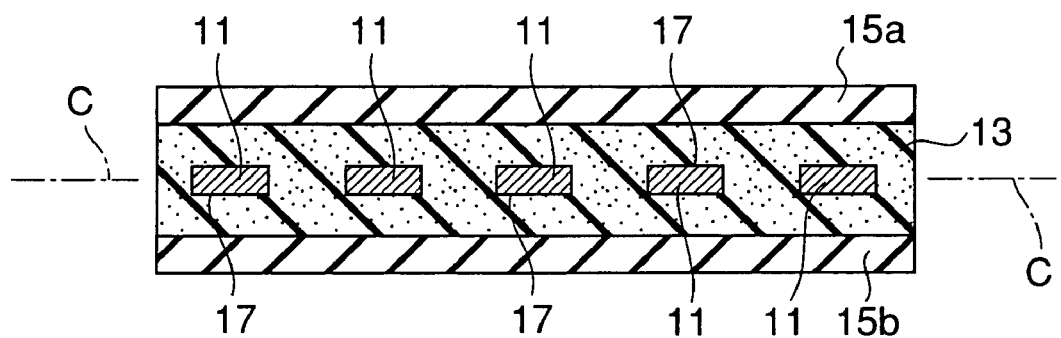
FIG. 1 is a sectional view showing a first embodiment of an electrical connection component according to this invention.
Figure 2:
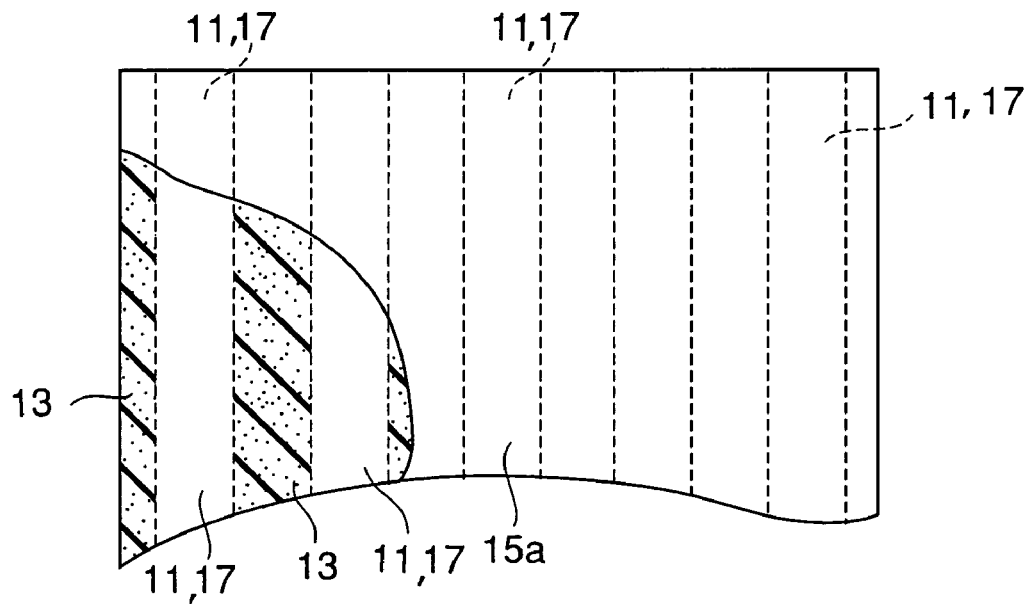
FIG. 2 is a plan view showing, partly in section, the electrical connection component shown in FIG. 1.

Hereinbelow, description will be made about a first embodiment of an electrical connection component according to this invention. FIGS. 1 and 2 show the electrical connection component in the first embodiment of this invention.

Referring to FIGS. 1 and 2, the electrical connection component comprises plate-like flexible conductive pattern members 11, a sheet-like gel member 13 having the conductive pattern members 11 embedded therein, and two flexible base material sheets 15a and 15b provided on the front and back surfaces of the gel member 13 to retain the gel member 13 therebetween.

Describing in further detail, the conductive pattern members 11 are each in the form of a metal plate having a high elastic modulus and a small thickness dimension and formed into a pattern shape. As a metal material of the conductive pattern member 11, use is made of at least one kind of nickel, a nickel alloy, nickel based alloys sold under the trademark MONEL, nickel palladium, copper, phosphor bronze, and the like.

The gel member 13 is in the form of a jelly obtained by solidifying particles in a colloidal solution. As the gel sheet 13, a silicon or acrylic member is used. As the base material sheet 15a, 15b, use is made of a resin sheet of polyimide, PET, polyester, or the like.

Figure 3:
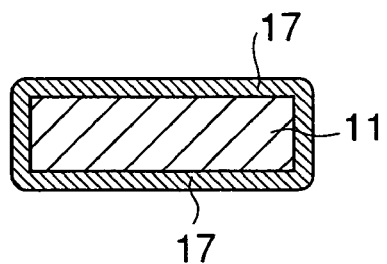
FIG. 3 is a sectional view showing, a conductive pattern member and a thin film conductive layer of the electrical connection component shown in FIG. 1.

Further, as shown in FIG. 3, the electrical connection component in this embodiment has at least one thin film conductive layer 17 coated on each conductive pattern member 11. As the thin film conductive layer 17, use is made of a metal material having a conductivity higher than that of the conductive pattern member 11. As the metal material having the conductivity higher than that of the conductive pattern member 11, a metal plating layer, for example, is desirable.

Hereinbelow, description will be made about a method of manufacturing the electrical connection component. At first, a metal plate having a small thickness dimension is blanked into the belt-plate shaped conductive pattern members 11 by press working. Then, the thin film conductive layer 17 is formed by applying metal plating to external surfaces of each conductive pattern member 11, thereby preparing the conductive pattern members 11 each having the thin film conductive layer 17. Further, the conductive pattern members 11 each having the thin film conductive layer 17 are embedded with respect to, as a reference, a neutral line C (see FIG. 1) bisecting the gel member 13 in a thickness direction thereof.

In this embodiment, each conductive pattern member 11 is embedded at a position including the neutral line C such that the plate surfaces thereof are oriented so as to be parallel to the base material sheets 15a and 15b. Then, the gel member 13 is, at its front and back surfaces, sandwiched between the two base material sheets 15a and 15b so as to be retained, thereby obtaining the electrical connection component.

In the electrical connection component thus manufactured, although the conductive pattern members 11 are bent in response to an external bending force, the electrical connection component has a function to deform the gel member 13 so as to displace the conductive pattern members 11 on the neutral line C in this event and, therefore, the stress caused by the bending due to the external force is dispersed by the gel member 13 and thus is not concentrated at the conductive pattern members 11.

Next, the bending resistance was compared between an electrical connection component of this invention manufactured based on the first embodiment and a well-known FPC (flexible printed circuit).

In the electrical connection component of this invention, use was made of conductive pattern members 11 each made of nickel and having a thickness of 4 μm and the interval (pitch) of the conductive pattern members 11 at the neutral line C was set in the range of 0.1 to 1.0 mm. A thin film conductive layer 17 was formed by plating gold onto each conductive pattern member 11 to a thickness of 0.5 μm. As the base material sheet 15a, 15b, use was made of a polyimide resin sheet having a thickness of 30 μm and a length of 5 cm.

With respect to the FPC compared with the electrical connection component of this invention, use was made of conductive pattern members and base material sheets having the same sizes as those of the foregoing conductive pattern members 11 and base material sheets 15a and 15b. A repetitive bending test was performed wherein the electrical connection component of this invention and the FPC were subjected to bending with a diameter of 3 mm. As a result, the resistive number of bending times of the FPC was 100,000 at maximum while the resistive number of bending times of the electrical connection component of this invention was 200,000.

Figure 4:
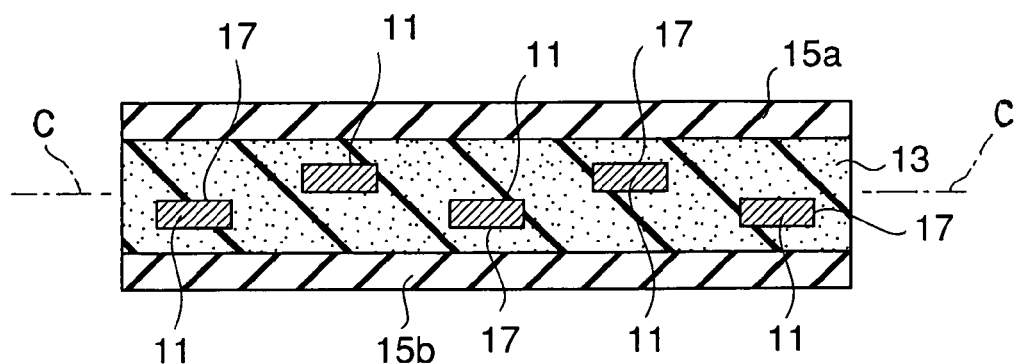
FIG. 4 is a sectional view showing a second embodiment of an electrical connection component according to this invention.

FIG. 4 shows a second embodiment of an electrical connection component. In description of the second embodiment, the same symbols are assigned to portions that are the same as those of the electrical connection component described in the first embodiment, thereby omitting explanation thereof.

In the electrical connection component of the second embodiment, conductive pattern members 11 each having a thin film conductive layer 17 are disposed alternately on upper and lower sides with respect to, as a reference, a neutral line C bisecting a gel member 13 in a thickness direction thereof.

Figure 5:
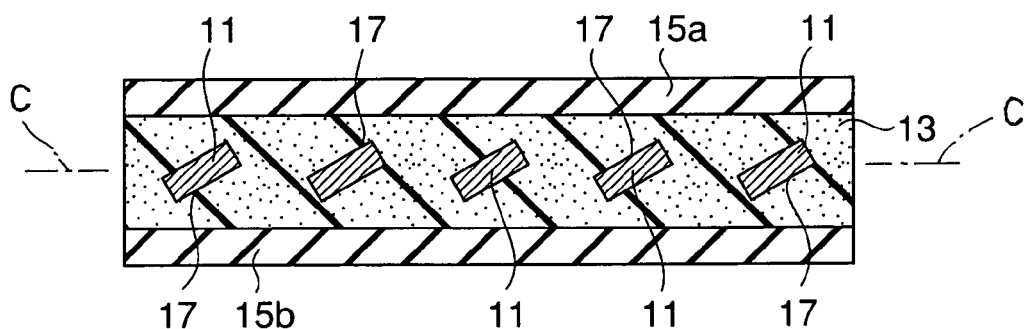
FIG. 5 is a sectional view showing a third embodiment of an electrical connection component according to this invention.

FIG. 5 shows a third embodiment of an electrical connection component. In description of the third embodiment, the same symbols are assigned to portions that are the same as those of the electrical connection component described in the first embodiment, thereby omitting explanation thereof.

In the electrical connection component of the third embodiment, conductive pattern members 11 each having a thin film conductive layer 17 are disposed with respect to, as a reference, a neutral line C bisecting a gel member 13 in a thickness direction thereof so that plate surfaces of each conductive pattern member 11 are oriented obliquely in a direction to cross the neutral line C.

Figure 6:
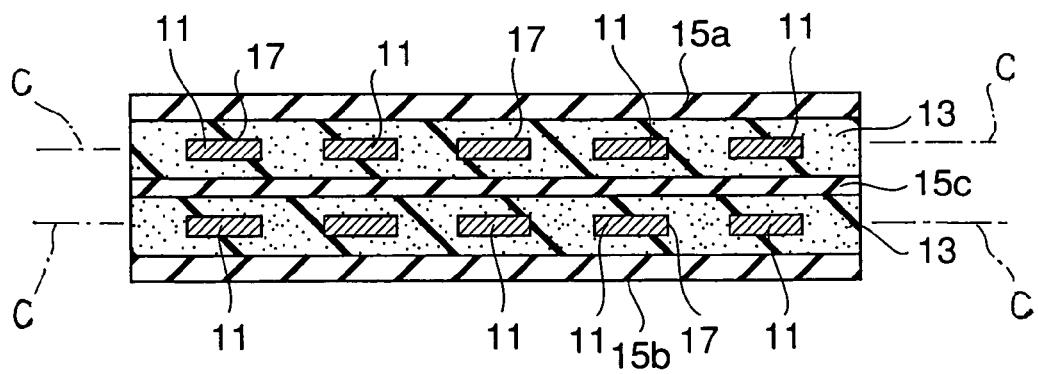
FIG. 6 is a sectional view showing a fourth embodiment of an electrical connection component according to this invention.

FIG. 6 shows a fourth embodiment of an electrical connection component. In description of the fourth embodiment, the same symbols are assigned to portions that are the same as those of the electrical connection component described in the first embodiment, thereby omitting explanation thereof.

In the electrical connection component of the fourth embodiment, a gel member 13 is divided into an upper gel member 13 and a lower gel member 13 by a base material sheet 15c added in a thickness direction thereof. In each of the upper and lower gel members 13, conductive pattern members 11 each having a thin film conductive layer 17 are embedded with respect to, as a reference, a neutral line C bisecting the corresponding gel member 13 in a thickness direction thereof so that each conductive pattern member 11 is oriented to include the corresponding neutral line C.

The electrical connection components described in the second and third embodiments can be manufactured by the use of the manufacturing method of the electrical connection component described in the first embodiment. In each of the electrical connection components in the second and third embodiments, although the conductive pattern members 11 are bent in response to an external bending force, the electrical connection component has a function to deform the gel member 13 so as to displace the conductive pattern members 11 toward the neutral line C in this event and, therefore, the stress caused by the bending due to the external force is dispersed by the gel member 13 and thus is not concentrated at the conductive pattern members 11.

It is needless to say that it is possible to change designs, depending on the purpose of use, not only of the structures of the electrical connection components in the first to fourth embodiments, but also of the materials, thickness dimensions, width dimensions, etc. of the conductive pattern members 11, the gel members 13, and the base material sheets 15a, 15b, and 15c and, further, the arrangement and orientation of the conductive pattern members 11 at the neutral line C can be properly performed.

As described above in terms of the embodiments, according to the electrical connection component of this invention, the flexible conductive pattern members are each provided on its external surfaces with the metal thin film layer formed by metal plating and embedded in the gel member and this gel member is protected by the base material sheets and, therefore, the conductive pattern members can have the function of deforming the gel member to displace in response to bending caused by the external force.

Therefore, since the stress caused by the bending due to the external force is dispersed by the gel member and thus is not concentrated at the conductive pattern members, the electrical connection component has the bending resistance that is twice or more the conventional FPC and the particular processing for the bending becomes unnecessary.

The invention claimed is:

1. An electrical connection component comprising a plurality of plate-like flexible conductive pattern members, a sheet-like gel member having said conductive pattern members embedded therein, flexible base material sheets retaining said gel member therebetween, a thin film conductive layer coating an external surface of each of said conductive pattern members, and an additional flexible base material sheet bisecting said gel member in a thickness direction of said gel member into two gel portions, said conductive pattern members being disposed in said gel portions, respectively.

2. An electrical connection component according to claim 1 wherein said thin film conductive layer is a metal plating layer having a conductivity greater than that of said conductive pattern member.

3. An electrical connection component comprising a plurality of plate-like flexible conductive pattern members, a sheet-like gel member having said conductive pattern members embedded therein, and flexible base material sheets retaining said gel member therebetween, said conductive pattern members being disposed on both sides of a neutral line which bisects said gel member in a thickness direction of said gel member, said conductive pattern members being displaced from one another between said both sides in a direction of said neutral line.

4. An electrical connection component according to claim 3, comprising a plurality of thin film conductive layers coating external surfaces of said conductive pattern members.

5. An electrical connection component according to claim 4, wherein each of said thin film conductive layers is a metal plating layer having a conductivity greater than that of said conductive pattern member.

6. An electrical connection comprising a plurality of plate-like flexible conductive pattern members, a sheet-like gel member having said conductive pattern members embedded therein, and flexible base material sheets retaining said gel member therebetween, said conductive pattern members being disposed on a neutral line bisecting said gel member in a thickness direction of said gel member, each of said conductive pattern members being oriented obliquely to the neutral line.

7. An electrical connection component according to claim 6, wherein a respective thin film conductive layer is coated over an external surface of each of said conductive pattern members and said thin film conductive layer is a metal plating layer having a conductivity greater than that of said conductive pattern member.

* * * * *